(12) United States Patent
Tseng et al.

(10) Patent No.: US 11,955,186 B2
(45) Date of Patent: Apr. 9, 2024

(54) MEMORY DEVICE AND DATA SEARCH METHOD FOR IN-MEMORY SEARCH

(71) Applicant: MACRONIX INTERNATIONAL CO., LTD., Hsinchu (TW)

(72) Inventors: Po-Hao Tseng, Taichung (TW); Tian-Cih Bo, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 149 days.

(21) Appl. No.: 17/812,243

(22) Filed: Jul. 13, 2022

(65) Prior Publication Data

US 2024/0021254 A1 Jan. 18, 2024

(51) Int. Cl.
*G11C 16/34* (2006.01)
*G11C 16/26* (2006.01)
*G11C 16/30* (2006.01)
*G11C 15/04* (2006.01)

(52) U.S. Cl.
CPC .......... *G11C 16/3404* (2013.01); *G11C 16/26* (2013.01); *G11C 16/30* (2013.01); *G11C 15/04* (2013.01); *G11C 15/046* (2013.01)

(58) Field of Classification Search
None
See application file for complete search history.

(56) References Cited

U.S. PATENT DOCUMENTS

| 11,587,617 B2 | 2/2023 | Tseng et al. | |
| 2014/0198551 A1* | 7/2014 | Louie | G11C 15/04 365/49.1 |

FOREIGN PATENT DOCUMENTS

| TW | I766706 B | 6/2022 |
| WO | 2016167821 A1 | 10/2016 |

OTHER PUBLICATIONS

Tseng, P.H., et al.; "In-Memory-Searching Architecture Based on 3D-NAND Technology with Ultra-high Parallelism;" IEEE; 2020; pp. 36.1.1-36.1.4.

* cited by examiner

*Primary Examiner* — Tan T. Nguyen
(74) *Attorney, Agent, or Firm* — McClure, Qualey & Rodack, LLP

(57) ABSTRACT

A memory device for in-memory search is provided. The memory device includes a plurality of memory cells, and each of the memory cells stores a stored data and receives a search data, including a first transistor and a second transistor. The first transistor has a first threshold voltage and receives a first gate bias. The second transistor is connected to the first transistor, and the second transistor has a second threshold voltage and receives a second gate bias. The stored data is encoded according to the first threshold voltage and the second threshold voltage, and the search data is encoded according to the first gate bias and the second gate bias. There is a mismatch distance between the stored data and the search data. An output current generated by each of the memory cells is related to the mismatch distance.

16 Claims, 14 Drawing Sheets

MEMORY DEVICE AND DATA SEARCH METHOD FOR IN-MEMORY SEARCH

TECHNICAL FIELD

The present disclosure relates to a semiconductor device and a data processing method, and more particularly, related to a memory device and a data search method for in-memory search (IMS).

BACKGROUND

In response to the requirements of artificial intelligence (AI) and big data, various algorithms often need to perform a large amount of data processing, including data search and data comparison. With the mature development of semiconductor technology, a large amount of stored data may be stored in a memory device, and data processing is performed inside the memory device according to the stored data. For example, in-memory search (IMS) and in-memory computation (IMC) may be performed.

In the in-memory search operation, an exact matching mechanism may be used. When the stored data stored in the memory device completely matches the search data, a bit line corresponding to the memory cell storing the stored data may generate an output current. That is, when the stored data does not match the search data, regardless of the "degree of mismatch", the corresponding bit line does not generate any output current. However, the exact matching mechanism cannot further determine the "degree of mismatch" between the stored data and the search data, which will severely limit the flexibility of matching.

In view of the above-mentioned defects of the exact matching mechanism, it is necessary to propose an improved data search method and a corresponding structure of a memory device, which may carry out approximate searching to achieve a technical effect of approximate matching.

SUMMARY

According to an aspect of the present disclosure, a memory device for in-memory search is provided. The memory device includes a plurality of memory cells, and each of the memory cells stores a stored data and receives a search data, including a first transistor and a second transistor. The first transistor has a first threshold voltage and receives a first gate bias. The second transistor is connected to the first transistor, and the second transistor has a second threshold voltage and receives a second gate bias. The stored data is encoded according to the first threshold voltage and the second threshold voltage, and the search data is encoded according to the first gate bias and the second gate bias. There is a mismatch distance between the stored data and the search data. An output current generated by each of the memory cells is related to the mismatch distance.

According to another aspect of the present disclosure, a data search method for a memory is provided. The memory comprises a plurality of memory cells, each of the memory cells comprises a first transistor and a second transistor, and the data search method comprising the following steps. Encoding a stored data according to a first threshold voltage of the first transistor and a second threshold voltage of the second transistor. Encoding a search data according to a first gate bias and a second gate bias, and there is a mismatch distance between the stored data and the search data. Wherein an output current generated by each of the memory cells is related to the mismatch distance.

Figure 1:
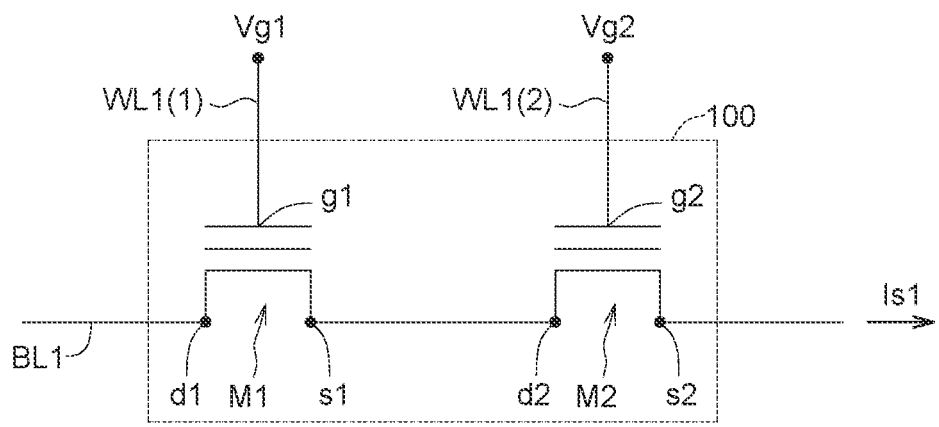
FIG. 1 is a schematic diagram of a memory cell according to an embodiment of the present disclosure.
Figure 2:
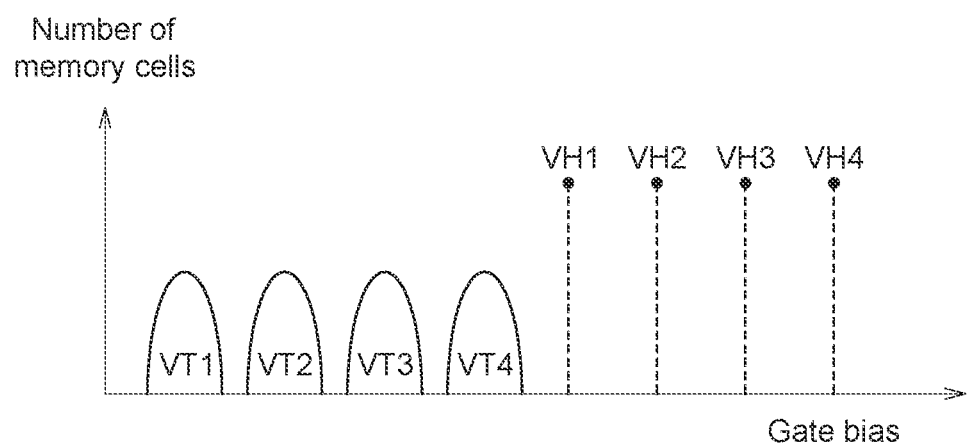
FIG. 2 shows a relationship of magnitude of voltage between the first to fourth bias values and the first to fourth voltage distributions.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a schematic diagram of a memory cell 100 according to an embodiment of the present disclosure. The memory cell 100 is a unit of a memory device, and the memory device is used for performing in-memory search. Referring to FIG. 1, the memory cell 100 includes two transistors M1, M2 connected in series. The transistor M1 may be referred to as a "first transistor", and the transistor M2 may be referred to as a "second transistor". The transistor M1 includes a first drain d1, a first source s1 and a first gate g1. The transistor M2 includes a second drain d2, a second source s2 and a second gate g2. The first drain d1 of the transistor M1 is connected to one of the bit lines (e.g., the first bit line BL1) of the memory device. The first source s1 of the transistor M1 is connected to the second drain d2 of the transistor M2. The first gate g1 of the transistor M1 and the second gate g2 of the transistor M2 are connected to one set of word lines of the memory device. For example, the first set of word lines WL1 of the memory device includes a first word line WL1(1) and a second word line WL1(2), and the first gate g1 of the transistor M1 is connected to the first word line WL1(1), the second gate g2 of the transistor M2 is connected to the second word line WL1(2).

The transistor M1 has a first threshold voltage Vth1, and the transistor M2 has a second threshold voltage Vth2. The transistors M1 and M2 have floating gates, and a programming voltage may be applied to change the first threshold voltage Vth1 and the second threshold voltage Vth2. In one example, the transistors M1 and M2 are both multi-level cells (MLCs). Both the first threshold voltage Vth1 of the transistor M1 and the second threshold voltage Vth2 of the transistor M2 may be adjusted as a first number of voltage distributions, and the first number is "4". The four voltage distributions refer to, in an order according to magnitude of the voltage, the fourth voltage distribution VT4, the third voltage distribution VT3, the second voltage distribution VT2, and the first voltage distribution VT1. In another example, the transistors M1 and M2 are both triple-level cells (TLCs), the first threshold voltage Vth1 and the second threshold voltage Vth2 may be adjusted as a second number of voltage distributions, the second number is "8". In yet another example, the transistors M1 and M2 are both quad-level cells (QLCs), and both the first threshold voltage Vth1 and the second threshold voltage Vth2 may be adjusted as a third number of voltage distributions, the third number is "16". In the following paragraphs, embodiments of FIGS. 2, 3, 4A-4B, 5A-5B, 6A-6B, 7A-7B, 8A-8B and 9A-9B are described by taking transistors M1 and M2 of MLC as examples.

The memory cell 100 may store a stored data DAT, wherein the stored data DAT includes a first bit D1 and a second bit D2. The stored data DAT is encoded according to the first threshold voltage Vth1 and the second threshold voltage Vth2. That is, the stored data DAT is encoded according to the first to fourth voltage distributions VT1 to VT4 of the first threshold voltage Vth1 and the first to fourth voltage distributions VT1 to VT4 of the second threshold voltage Vth2, as shown in Table 1:

TABLE 1

| [Vth1 Vth2] | DAT = [D1 D2] |
|---|---|
| [VT1 VT4] | [0 0] |
| [VT2 VT3] | [0 1] |
| [VT3 VT2] | [1 0] |
| [VT4 VT1] | [1 1] |
| [VT1 VT3] | [0 X] (i.e., [0 0] or [0 1]) |
| [VT1 VT2] | [X 0] (i.e., [1 0] or [0 0]) |
| [VT3 VT1] | [1 X] (i.e., [1 0] or [1 1]) |
| [VT2 VT1] | [X 1] (i.e., [0 1] or [1 1]) |
| [VT4 VT4] | invalid data |
| [VT1 VT1] | DNC (don't care) |

In the example of Table 1, when the first threshold voltage Vth1 and the second threshold voltage Vth2 are the first voltage distribution VT1 and the fourth voltage distribution VT4, respectively, the first bit D1 and the second bit D2 of the encoded stored data DAT are "0" and "0". When both the first threshold voltage Vth1 and the second threshold voltage Vth2 are the fourth voltage distribution VT4, the encoded stored data DAT is invalid data. When both the first threshold voltage Vth1 and the second threshold voltage Vth2 are the first voltage distribution VT1, the encoded stored data DAT is "don't care" DNC.

Furthermore, when the first threshold voltage Vth1 and the second threshold voltage Vth2 are the first voltage distribution VT1 and the third voltage distribution VT3, respectively, the first bit D1 and the second bit D2 of the encoded stored data DAT are "0" and "X", indicating that the stored data DAT is [0 0] or [0 1]. When the first threshold voltage Vth1 and the second threshold voltage Vth2 are the first voltage distribution VT1 and the second voltage distribution VT2, respectively, the first bit D1 and the second bit D2 of the encoded stored data DAT are "X" and "0", indicating that the stored data DAT is [1 0] or [0 0].

Similarly, When the first threshold voltage Vth1 and the second threshold voltage Vth2 are the third voltage distribution VT3 and the first voltage distribution VT1, respectively, the encoded stored data DAT is [1 X], i.e., the stored data DAT is [1 0] or [1 1]. When the first threshold voltage Vth1 and the second threshold voltage Vth2 are the second voltage distribution VT2 and the first voltage distribution VT1, respectively, the encoded stored data DAT is [X 1], i.e., the stored data DAT is [0 1] or [1 1].

When performing the in-memory search, the transistor M1 receives the first gate bias Vg1 through the first word line WL1(1), and the transistor M2 receives the second gate bias Vg2 through the second word line WL1(2). In operation, the first gate bias Vg1 and the second gate bias Vg2 may be respectively adjusted as a first number of bias values (i.e., 4 bias values) referring to, in an order according to magnitude of the voltage: the fourth bias value VH4, third bias value VH3, second bias value VH2, and first bias value VH1. Moreover, the voltage value of each of the first to fourth bias values VH1-VH4 is greater than the first to fourth voltage distributions VT1-VT4. The relationship of magnitude of voltage is: fourth bias value VH4>third bias value VH3>second bias value VH2>first bias value VH1>fourth voltage distribution VT4>third voltage distribution VT3>second voltage distribution VT2>first voltage distribution VT1. That is, the first bias value VH1 with the lowest voltage value is still greater than the fourth voltage distribution VT4 with the highest voltage value. The relationship of magnitude of voltage between the above-mentioned first to fourth bias values VH1-VH4 and the first to fourth voltage distributions VT1-VT4 may be seen in FIG. 2.

The memory cell 100 may receive a search data SW, wherein the search data SW includes a first bit S1 and a second bit S2. The search data SW may be encoded according to the first gate bias Vg1 and the second gate bias Vg2. That is, the search data SW is encoded according to the first to fourth bias values VH1-VH4 of the first gate bias Vg1 and the first to fourth bias values VH1-VH4 of the second gate bias Vg2, as shown in Table 2:

TABLE 2

| [Vg1 Vg2] | SW = [S1 S2] |
|---|---|
| [VH1 VH4] | [0 0] |
| [VH2 VH3] | [0 1] |
| [VH3 VH2] | [1 0] |

TABLE 2-continued

| [Vg1 Vg2] | SW = [S1 S2] |
|---|---|
| [VH4 VH1] | [1 1] |
| [VH4 VH4] | "Wildcard" WCD |

In the example of Table 2, when the first gate bias Vg1 and the second gate bias Vg2 are respectively the first bias value VH1 and the fourth bias value VH4, the first bit S1 and the second bit S2 of the encoded search data SW, are "0" and "0". When the first gate bias Vg1 and the second gate bias Vg2 are both the fourth bias value VH4, the encoded search data SW is a "wildcard" WCD.

In operation, there is a first voltage difference between the first gate bias Vg1 received by the transistor M1 and the first threshold voltage Vth1 of the transistor M1, and the transistor M1 generates a current I1 according to the first voltage difference. Similarly, there is a second voltage difference between the second gate bias Vg2 received by the transistor M2 and the second threshold voltage Vth2 of the transistor M2, and the transistor M2 generates a current I2 according to the second voltage difference. Since the transistor M1 is connected to the transistor M2 in series, the current value of the output current Is1 generated by the memory cell 100 on the bit line BL1 is substantially equal to the smaller one of current value of the current I1 and the current I2. The output current Is1 is generated at the second source s2 of the transistor M2.

Figure 3:
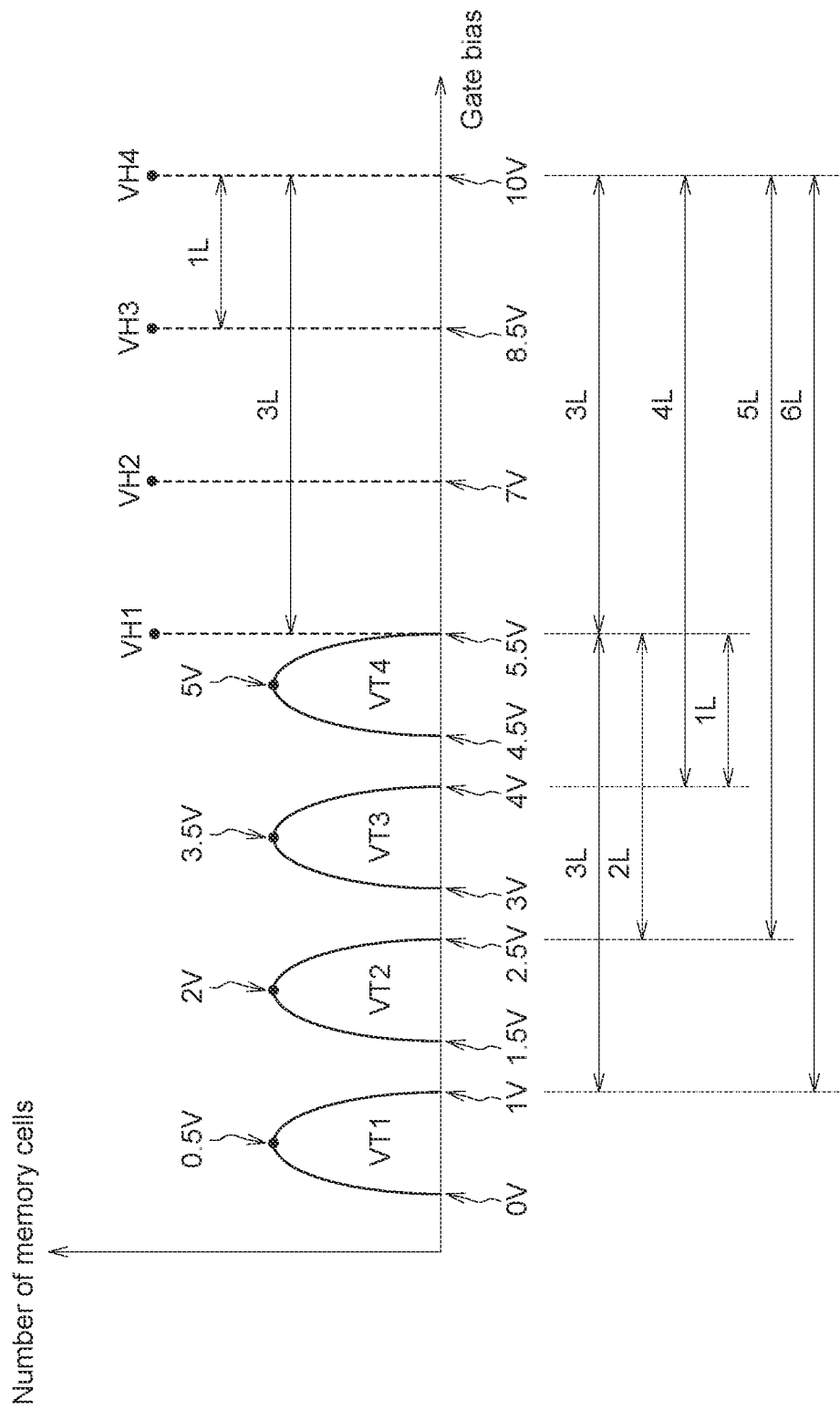
FIG. 3 shows examples of voltage values of the first to fourth bias values, the first to fourth voltage distributions, the first voltage difference and the second voltage difference.

FIG. 3 shows examples of voltage values of the first to fourth bias values VH1-VH4, the first to fourth voltage distributions VT1-VT4, the first voltage difference and the second voltage difference. In the example of FIG. 3, the first to fourth bias values VH1-VH4 are 5.5V, 7V, 8.5V and 10V, respectively. In addition, the lowest voltage value of the first voltage distribution VT1 is 0V, the highest voltage value is 1V, and the peak voltage value is 0.5V. The lowest voltage value of the second voltage distribution VT2 is 1.5V, the highest voltage value is 2.5V, and the peak voltage value is 2V. The lowest voltage value of the third voltage distribution VT3 is 3V, the highest voltage value is 4V, and the peak voltage value is 3.5V. The lowest voltage value of the fourth voltage distribution VT4 is 4.5V, the highest voltage value is 5.5V, and the peak voltage value is 5V.

In operation, different search data SW may be provided to search the stored data DAT stored in the memory cell 100. FIGS. 4A to 4D are schematic diagrams showing a scenario for searching stored data DAT of different contents when providing search data SW of [0 0]. Please refer to FIG. 4A first, when the search data SW is [0 0], the first gate bias Vg1 received by the transistor M1 is the first bias value VH1, and the second gate bias Vg2 received by the transistor M2 is the fourth bias value VH4. When the stored data DAT is [0 0], the first threshold voltage Vth1 is the first voltage distribution VT1, and the second threshold voltage Vth2 is the fourth voltage distribution VT4.

The first voltage difference between the first gate bias Vg1 of the transistor M1 and the first threshold voltage Vth1 is a "gate overdrive voltage difference". When the search data SW is [0 0] and the stored data DAT is [0 0], the first gate bias Vg1 is the first bias value VH1, and the first threshold voltage Vth1 is the first voltage distribution VT1. The voltage difference between the first bias value VH1 (5.5V) and the highest voltage value (1V) of the first voltage distribution VT1 is 4.5V. That is, the first voltage difference between the first gate bias Vg1 of the transistor M1 and the first threshold voltage Vth1 is 4.5V.

The voltage difference between two adjacent bias values among the first to fourth bias values VH1-VH4 is defined as a predefined level, referred to as "1-level (1L)". Similarly, for the first to fourth voltage distributions VT1-VT4, the voltage difference between respective highest voltage values of the two adjacent voltage distributions is also equal to 1-level (1L). In the embodiment shown in FIG. 3, the voltage difference between two adjacent bias values is 1.5V, hence 1.5V is taken as the predefined level (i.e., 1-level). Accordingly, the first voltage difference 4.5V of the transistor M1 is 3-level (3L).

On the other hand, when the search data SW is [0 0] and the stored data DAT is [0 0], the voltage difference between the fourth bias value VH4 (10V) of the transistor M2 and the highest voltage value (5.5V) of the fourth voltage distribution VT4 is 4.5V. That is, the second voltage difference between the second gate bias Vg2 of the transistor M2 and the second threshold voltage Vth2 is 4.5V, which is 3-level (3L).

The current value of the current I1 generated by the transistor M1 corresponds to the first voltage difference of the transistor M1 (which is 3-level (3L)), and the current value of the current I2 generated by the transistor M2 corresponds to the second voltage difference (which is 3-level (3L)). The current I1 is equal to the current I2, hence the current value of the output current Is1 generated by the memory cell 100 is equal to the current I1 and the current I2. The gate overdrive voltage difference corresponding to the current value of the output current Is1 is 3-level (3L).

Both the stored data DAT and the search data SW are [0 0], and the mismatch distance between the stored data DAT and the search data SW is "0" (i.e., a complete match). When the stored data DAT and the search data SW are completely matched, the gate overdrive voltage difference corresponding to the current value of the output current Is1 is three-level (3L).

Figure 4A:
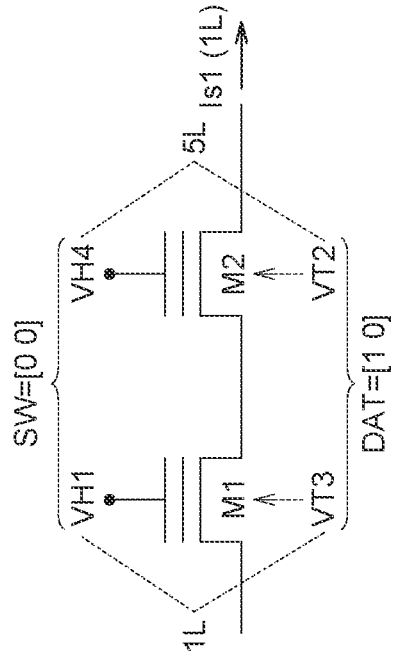
FIGS. 4A to 4D are schematic diagrams showing a scenario for searching stored data of different contents when providing search data of [0 0].
Figure 4C:
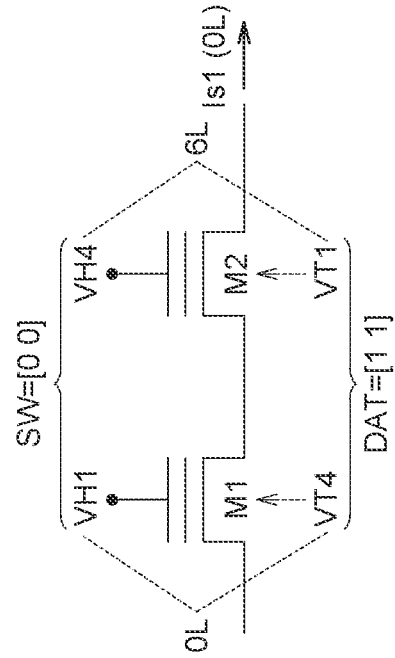
Figure 4B:
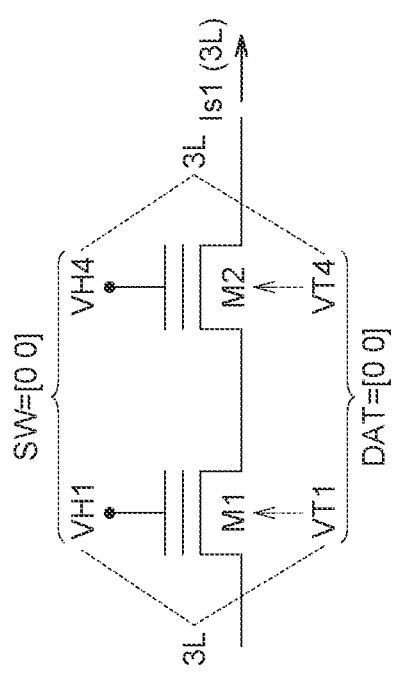

Next, referring to FIG. 4B, when the search data SW is [0 0] and the stored data DAT is [0 1], a mismatch distance between the stored data DAT and the search data SW is "1". The first voltage difference between the first bias value VH1 (5.5V) of the transistor M1 and the highest voltage value (2.5V) of the second voltage distribution VT2 is 3V (i.e., 2-level (2L)). The second voltage difference between the fourth bias value VH4 (10V) of the transistor M2 and the highest voltage value (4V) of the third voltage distribution VT3 is 6V (i.e., 4-level (4L)).

Accordingly, the current value of the current I1 corresponds to the first voltage difference of the transistor M1 (which is 2-level (2L)), and the current value of the current I2 corresponds to the second voltage difference of the transistor M2 (which is 4-level (4L)). The current I1 is smaller than the current I2, the output current Is1 generated by the memory cell 100 is the smaller one of the current I1 and the current I2, and the current value of the output current Is1 is equal to the current I1. The gate overdrive voltage difference corresponding to the current value of the output current Is1 is 2-level (2L).

Next, referring to FIG. 4C, when the search data SW is [0 0] and the stored data DAT is [1 0], the mismatch distance between the stored data DAT and the search data SW is "2". The first voltage difference between the first bias value VH1 (5.5V) of the transistor M1 and the highest voltage value (4V) of the third voltage distribution VT3 is 1.5V (i.e., 1-level (1L)). The second voltage difference between the fourth bias value VH4 (10V) of the transistor M2 and the highest voltage value (2.5V) of the second voltage distribution VT2 is 7.5V (i.e., 5-level (5L)). The current I1 is less than the current I2, the current value of the output current Is1 is equal to the current I1, and the gate overdrive voltage difference corresponding to the current value of the output current Is1 is 1-level (1L).

Figure 4D:
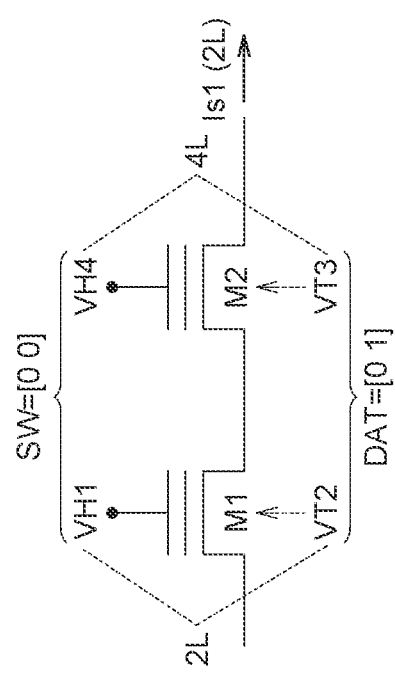

Next, referring to FIG. 4D, when the search data SW is [0 0] and the stored data DAT is [1 1], the mismatch distance between the stored data DAT and the search data SW is "3". The first voltage difference between the first bias value VH1 (5.5V) of the transistor M1 and the highest voltage value (5.5V) of the fourth voltage distribution VT4 is 0V (i.e., 0-level (0L)). The first voltage difference between the fourth bias value VH4 (10V) of the transistor M2 and the highest voltage value (1V) of the first voltage distribution VT1 is 9V (i.e., 6-level (6L)). Accordingly, the gate overdrive voltage difference corresponding to the current value of the output current Is1 is 0-level (0L).

From the above, when the mismatch distance between the search data SW and the stored data DAT is "0", "1", "2" and "3", the gate overdrive corresponding to the current value of the output current Is1 are "3L", "2L", "1L" and "0L". When the mismatch degree between the search data SW and the stored data DAT is higher, the mismatch distance is larger, and the current value of the output current Is1 is smaller. Accordingly, the mismatch distance and mismatch degree between the search data SW and the stored data DAT may be determined according to the current value of the output current Is1 of the memory cell 100.

FIGS. 5A to 5D are schematic diagrams showing a scenario for searching stored data DAT of different contents when providing search data SW of [1 0]. Please refer to FIG. 5A first, when the search data SW is [1 0] and the stored data DAT is [0 0], the mismatch distance is "2". The first voltage difference between the third bias value VH3 (8.5V) of the transistor M1 and the highest voltage value (1V) of the first voltage distribution VT1 is 7.5V (i.e., 5-level (5L)). The second voltage difference between the second bias value VH2 (7V) of the transistor M2 and the highest voltage value (5.5V) of the fourth voltage distribution VT4 is 1.5V (i.e., 1-level (1L)). The gate overdrive voltage difference corresponding to the current value of the output current Is1 is 1-level (1L).

Figure 5A:
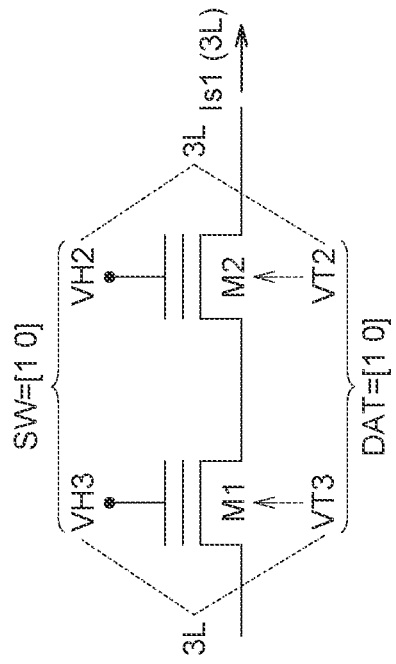
FIGS. 5A to 5D are schematic diagrams showing a scenario for searching stored data of different contents when providing search data of [1 0].
Figure 5C:
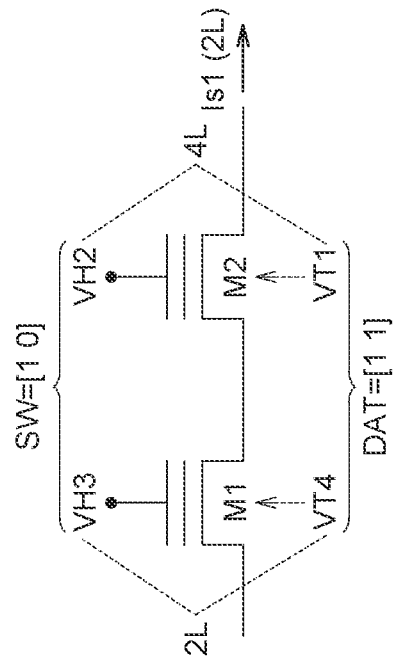
Figure 5B:
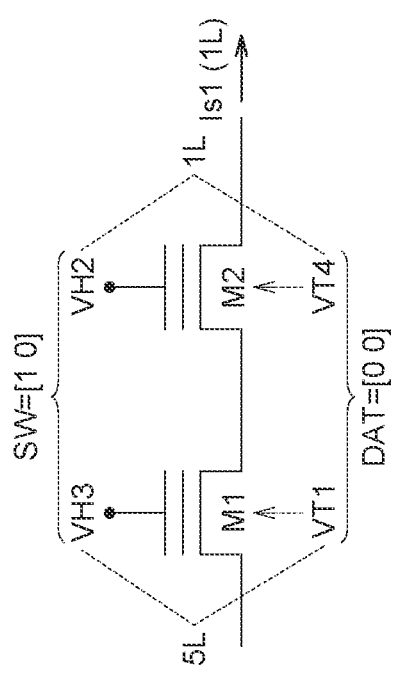

Referring to FIG. 5B, when the search data SW is [1 0] and the stored data DAT is [0 1], the mismatch distance is "1". The first voltage difference of the transistor M1 is 4-level (4L), and the second voltage difference of the transistor M2 is 2-level (2L). The gate overdrive voltage difference corresponding to the current value of the output current Is1 is 2-level (2L).

Referring to FIG. 5C, when the search data SW is [1 0] and the stored data DAT is [1 0], the mismatch distance is "0". The first voltage difference of the transistor M1 is 3-level (3L), and the second voltage difference of the transistor M2 is 3-level (3L). The gate overdrive voltage difference corresponding to the current value of the output current Is1 is 3-level (3L).

Figure 5D:
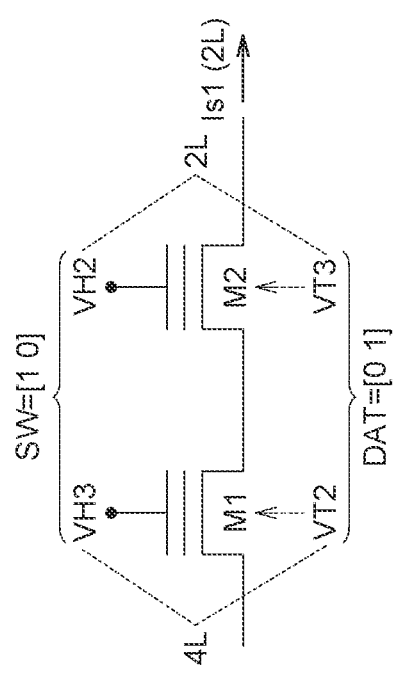
Figure 6A:
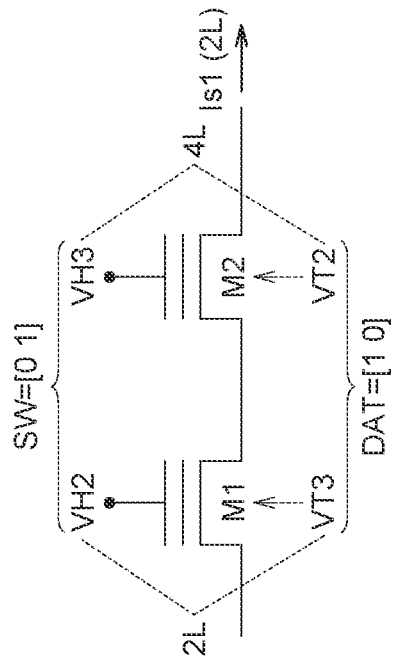
FIGS. 6A to 6D are schematic diagrams showing a scenario for searching stored data of different contents when providing search data of [0 1].
Figure 6C:
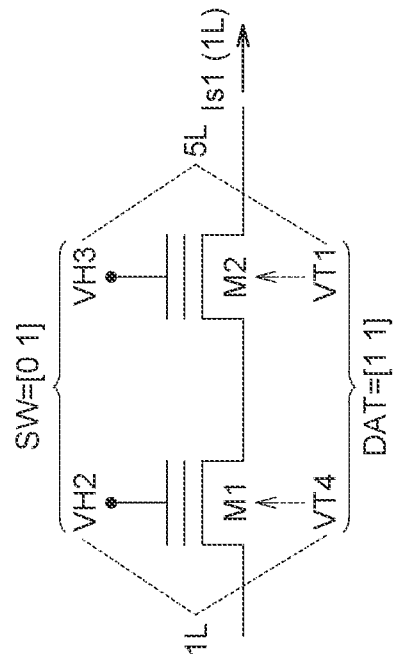
Figure 6B:
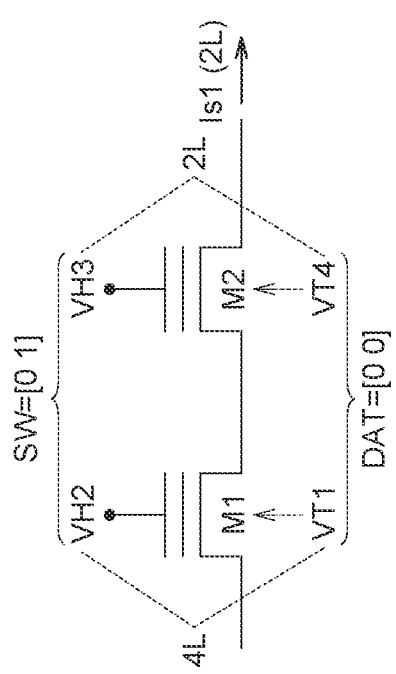
Figure 6D:
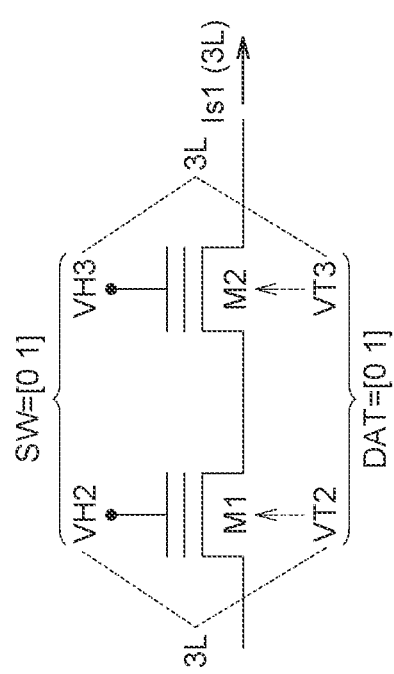
Figure 7A:
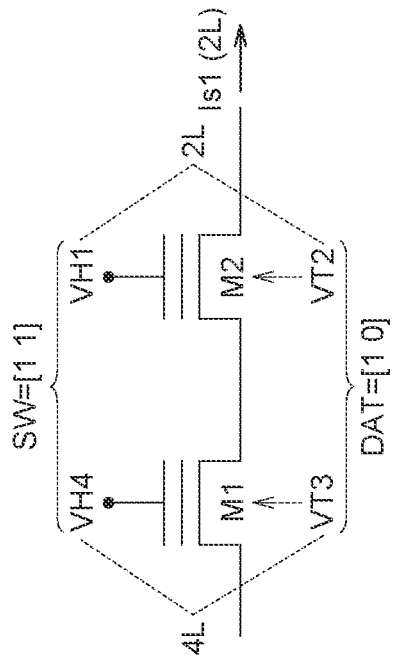
FIGS. 7A to 7D are schematic diagrams showing a scenario for searching stored data of different contents when providing search data of [1 1].
Figure 7C:
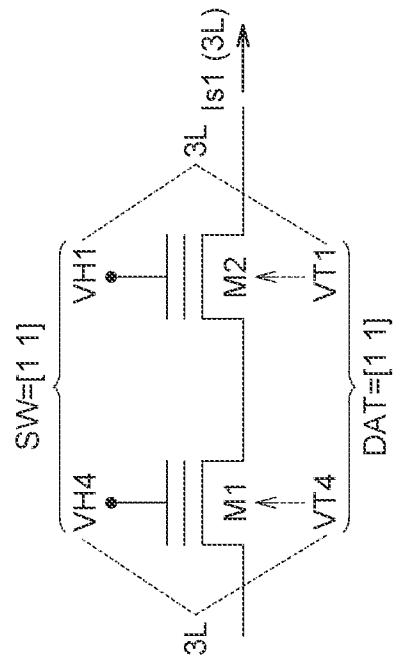
Figure 7B:
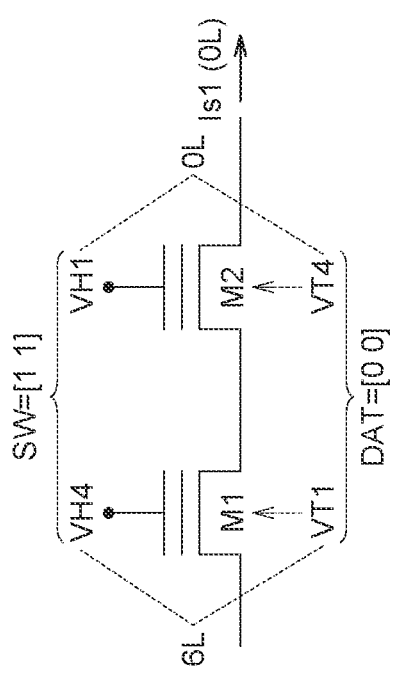
Figure 7D:
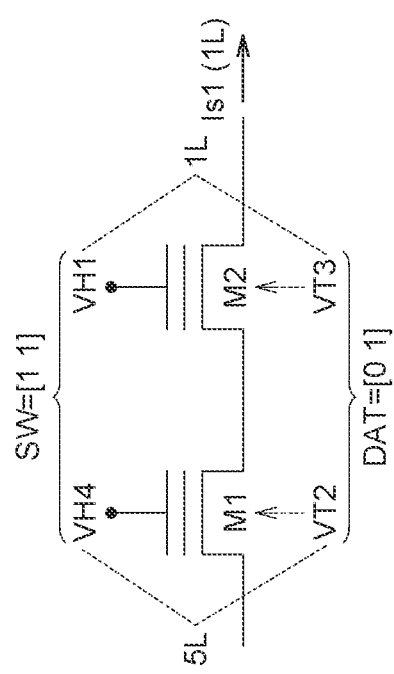

Referring to FIG. 5D, when the search data SW is [1 0] and the stored data DAT is [1 1], the mismatch distance is "1". The first voltage difference of the transistor M1 is 2-level (2L), and the second voltage difference of the transistor M2 is 4-level (4L). The gate overdrive voltage difference corresponding to the current value of the output current Is1 is 2-level (2L).

Based on the similar operation manner, referring to FIGS. 6A-6D, when the search data SW is [0 1], if the stored data DAT are [0 0], [0 1], [1 0] and [1 1], the mismatch distances are "1", "0", "1" and "2" respectively, and the current value of the output current Is1 corresponds to a gate overdrive voltage difference with levels of "2L", 3L", "2L" and "1L" respectively.

Similarly, referring to FIGS. 7A to 7D, when the search data SW is [1 1], if the stored data DAT are [0 0], [0 1], [1 0] and [1 1], the mismatch distances are "3", "2", "1" and "0" respectively, and the current value of the output current Is1 corresponds to a gate overdrive voltage difference with levels of "0L", 1L", "2L" and "3L" respectively.

Figure 8A:
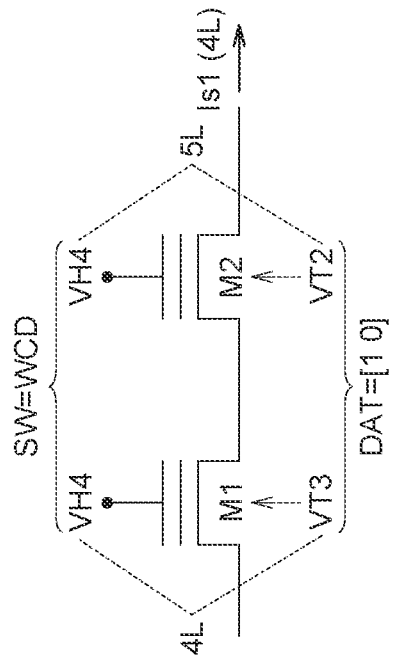
FIGS. 8A to 8D are schematic diagrams showing a scenario for searching stored data of different contents when providing search data of "wildcard".
Figure 8B:
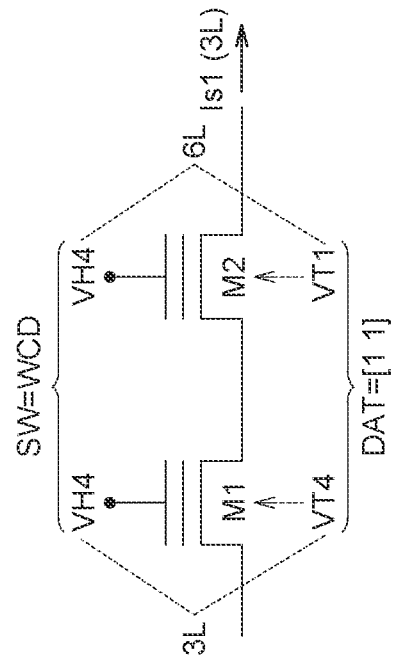
Figure 8C:
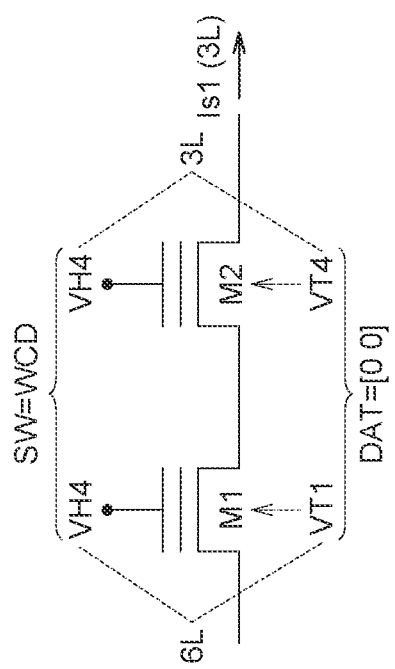
Figure 8D:
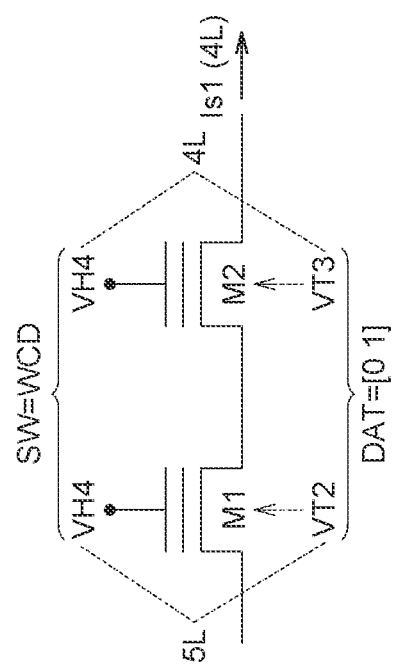

FIGS. 8A to 8D are schematic diagrams showing a scenario for searching stored data DAT of different contents when providing search data SW of "wildcard" WCD. Referring to FIG. 8A first, when the search data SW is "wildcard" WCD, the first gate bias Vg1 and the second gate bias Vg2 are both the fourth bias value VH4. When the stored data DAT is [0 0], the first voltage difference of the transistor M1 is 6-level (6L), and the second voltage difference of the transistor M2 is 3-level (3L). Referring to FIG. 8B, when the stored data DAT is [0 1], the first voltage difference of the transistor M1 is 5-level (5L), and the second voltage difference of the transistor M2 is 4-level (4L). Referring to FIG. 8C, when the stored data DAT is [1 0], the first voltage difference of the transistor M1 is 4-level (4L), and the second voltage difference of the transistor M2 is 5-level (5L). Referring to FIG. 8D, when the stored data DAT is [1 1], the first voltage difference of the transistor M1 is 3-level (3L), and the second voltage difference of the transistor M2 is 6-level (6L).

Accordingly, when the stored data DAT are respectively [0 0], [0 1], [1 0] and [1 1], and the current value of the output current Is1 corresponds a gate overdrive voltage difference with levels of "3L", "4L", "4L" and "3L" respectively. Under the condition that the gate overdrive voltage difference being levels of "3L" or "4L", the transistors M1 and M2 are both operated in the saturation region. Therefore, the current value of the output current Is1 corresponding to gate overdrive voltage difference of "4L" is substantially equal to the current value of the output current Is1 corresponding to gate overdrive voltage difference of "3L", and both are related to the mismatch distance of "0". Accordingly, when the search data SW is "wildcard" WCD, regardless of the content of the stored data DAT, the current value of the output current Is1 is related to the mismatch distance of "0", and it is determined that the search data SW and the stored data DAT are completely matched.

Figure 9A:
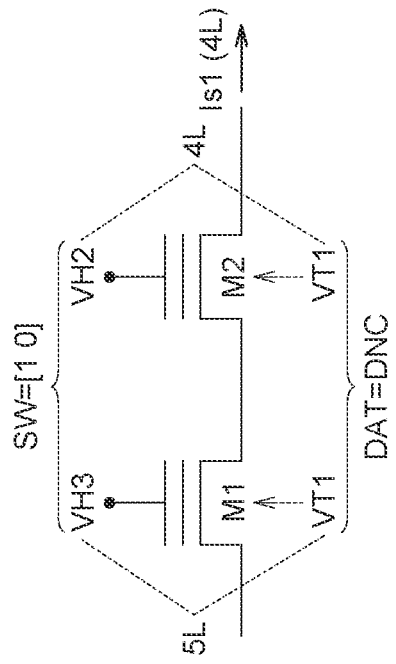
FIGS. 9A to 9D are schematic diagrams showing a searching scenario by search data of different contents, when stored data is "don't care".

FIGS. 9A to 9D are schematic diagrams showing a searching scenario by search data SW of different contents, when stored data DAT is "don't care" DNC. Referring to FIG. 9A first, when the stored data DAT is "don't care" DNC, the first threshold voltage Vth1 and the second threshold voltage Vth2 are both the first voltage distribution VT1. When the search data SW is [0 0], the first voltage difference of the transistor M1 is 3-level (3L), and the second voltage difference of the transistor M2 is 6-level (6L). The gate overdrive voltage difference corresponding to the current value of the output current Is1 is 3-level (3L).

Figure 9C:
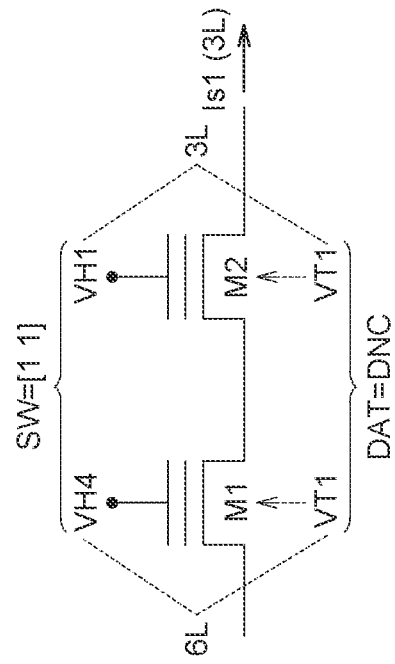
Figure 9B:
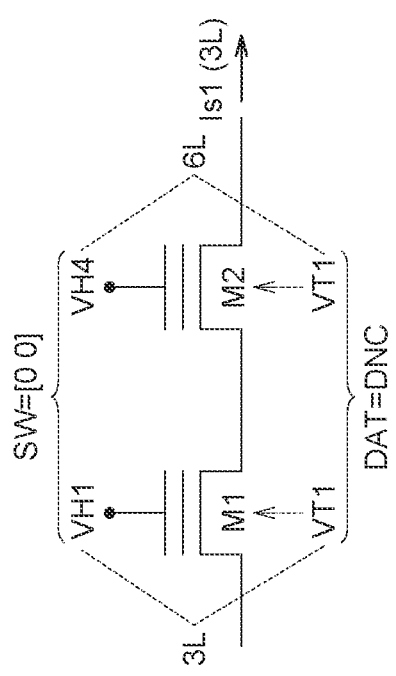
Figure 9D:
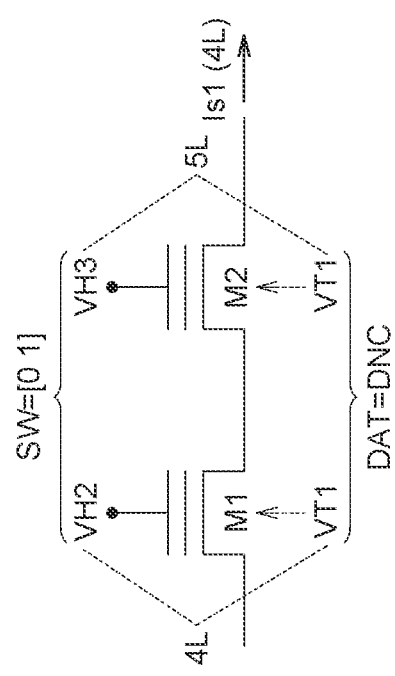

Similarly, referring to FIG. 9B, when the search data SW is [0 1], the first voltage difference of the transistor M1 is 4-level (4L), and the second voltage difference of the transistor M2 is 5-level (5L). Referring to FIG. 9C, when the search data SW is [1 0], the first voltage difference of the transistor M1 is 5-level (5L), and the second voltage difference of the transistor M2 is 4-level (4L). Referring to FIG. 9D, when the search data SW is [1 1], the first voltage difference of the transistor M1 is 6-level (6L), and the second voltage difference of the transistor M2 is 3-level (3L).

Accordingly, if the search data SW are respectively [0 0], [0 1], [1 0] and [1 1], the current value of the output current Is1 corresponds to gate overdrive voltage difference with levels of "3L", "4L", "4L" and "3L" respectively. For the gate overdrive voltage difference with levels of "3L" or "4L", the transistor M1 or the transistor M2 is operating in the saturation region, and the current value of the corresponding output current Is1 is related to the mismatch distance "0". Accordingly, when the stored data DAT is "don't care" DNC, regardless of the content of the search data SW, the output current Is1 is related to the mismatch distance "0", and it is determined that the search data SW and the stored data DAT are completely matched.

Figure 10:
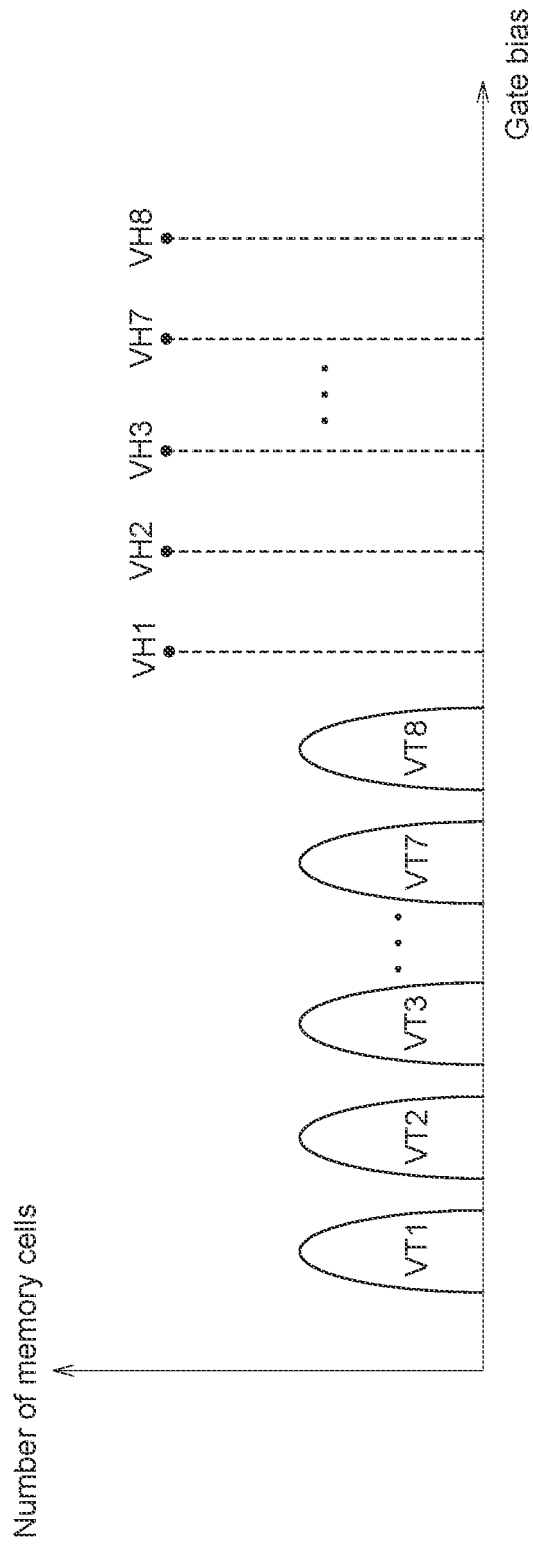
FIG. 10 shows the relationship of magnitude of voltage between the second number of bias values and the second number of voltage distributions of transistors of TLC type.
Figure 11:
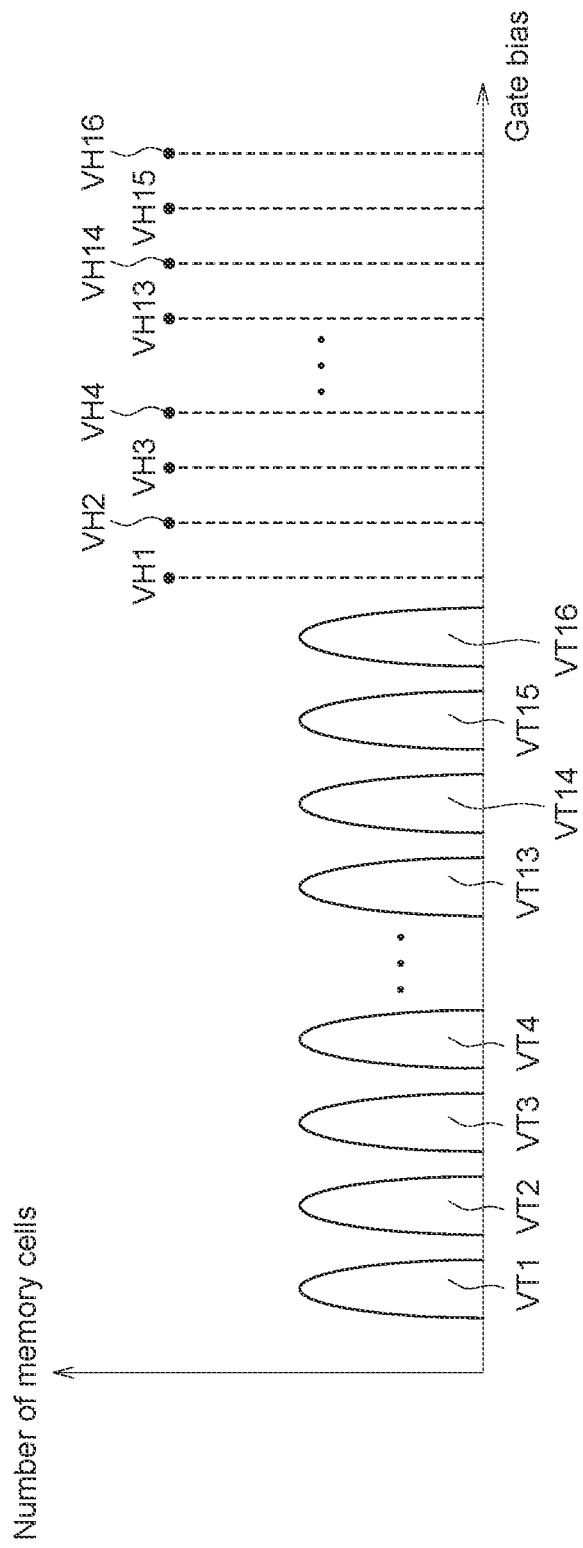
FIG. 11 shows a relationship of magnitude of voltage between the third number of bias values and the third number of voltage distributions of transistors of QLC type.
Figure 12:
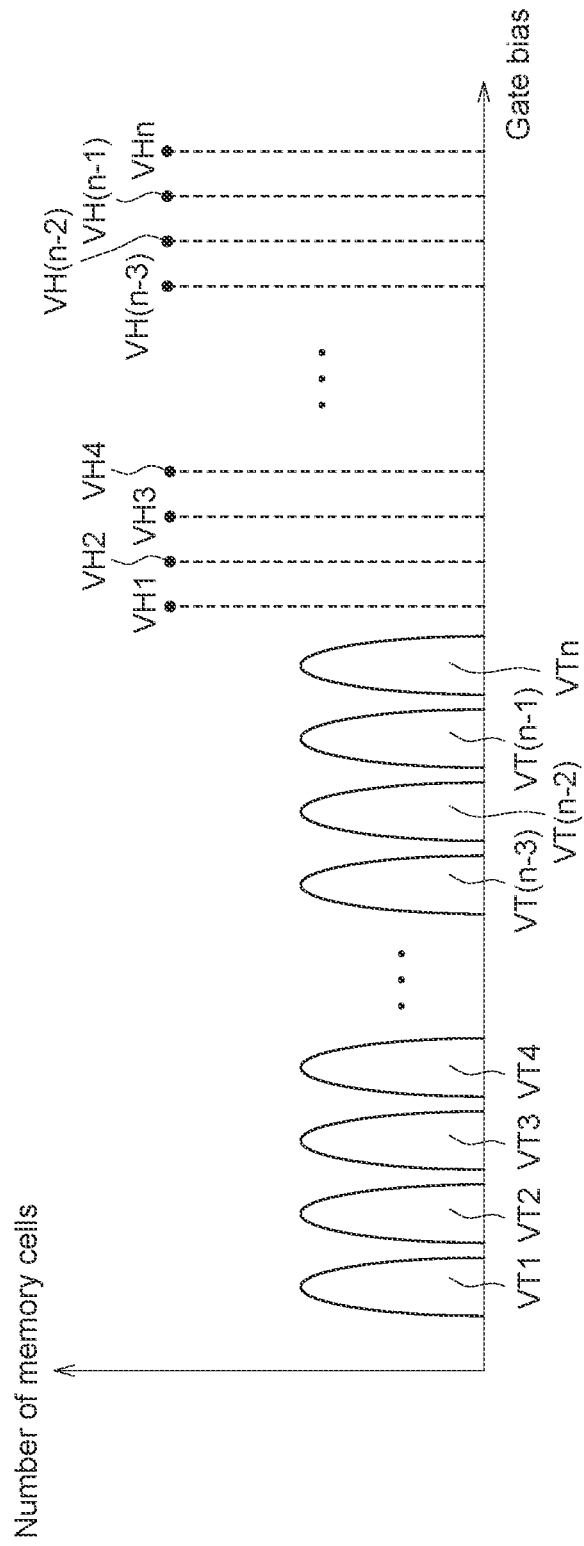
FIG. 12 shows a relationship of magnitude of voltage between the fourth number of bias values and the fourth number of voltage distributions of transistors of a type of N-level memory cell.

In the following paragraphs, embodiments of FIGS. 10, 11 and 12 are described by taking transistors M1 and M2 with a type of TLC, QLC and N-level memory unit as examples.

FIG. 10 shows a relationship of magnitude of voltage between the second number of bias values and the second number of voltage distributions of transistor M1 (or transistor M2) of TLC type. As shown in FIG. 10, when the transistors M1 and M2 are of both TLC type, the second number is equal to "8". Both the first threshold voltage Vth1 and the second threshold voltage Vth2 may be adjusted as 8 voltage distributions, in an order of magnitude of voltage, referring to: the eighth voltage distribution VT8, the seventh voltage distribution VT7, the sixth voltage distribution VT6, and the fifth voltage distribution VT5, a fourth voltage distribution VT4, a third voltage distribution VT3, a second voltage distribution VT2, and a first voltage distribution VT1. Correspondingly, the first gate bias Vg1 and the second gate bias Vg2 of the transistors M1 and M2 may be adjusted as 8 bias values, in an order of magnitude of voltage, referring to: the eighth bias value VH8, the seventh bias value VH7, a sixth bias value VH6, a fifth bias value VH5, a fourth bias value VH4, a third bias value VH3, a second bias value VH2, and a first bias value VH1. That is, the first bias value VH1 with the lowest voltage value is still larger than the eighth voltage distribution VT8 with the highest voltage value.

FIG. 11 shows a relationship of magnitude of voltage between the third number of bias values and the third number of voltage distributions of transistor M1 (or transistor M2) of QLC type. As shown in FIG. 11, when the transistors M1 and M2 are both of QLC type, the third number is equal to "16". Both the first threshold voltage Vth1 and the second threshold voltage Vth2 may be adjusted as 16 voltage distributions, in an order of magnitude of voltage, referring to: the sixteenth voltage distribution VT16 to the first voltage distribution VT1. Correspondingly, the first gate bias Vg1 and the second gate bias Vg2 of the transistors M1 and M2 may be respectively adjusted as 16 bias values, which refer to, according to the voltage magnitude: the sixteenth bias value VH16 to the first bias value VH1. That is, the first bias VH1 with the lowest voltage value is still larger than the sixteenth voltage distribution VT16 with the highest voltage value.

FIG. 12 shows a relationship of magnitude of voltage between the fourth number of bias values and the fourth number of voltage distributions of transistor M1 (or transistor M2) of a type of N-level memory cell. As shown in FIG. 12, when the transistors M1 and M2 are both N-level memory cells, the fourth number is equal to "n", and n is equal to 2 to the Nth power. Both the first threshold voltage Vth1 and the second threshold voltage Vth2 may be adjusted as n's voltage distributions: the n-th voltage distribution VT(n) to the first voltage distribution VT1. Correspondingly, the first gate bias Vg1 and the second gate bias Vg2 of the transistors M1 and M2 may be adjusted as n's bias values respectively, with an order of bias values as follows: the n-th bias value VH(n) to the first bias value VH1. That is, the first bias value VH1 with the lowest voltage value is still larger than the n-th voltage distribution VT(n) with the highest voltage value.

Figure 13:
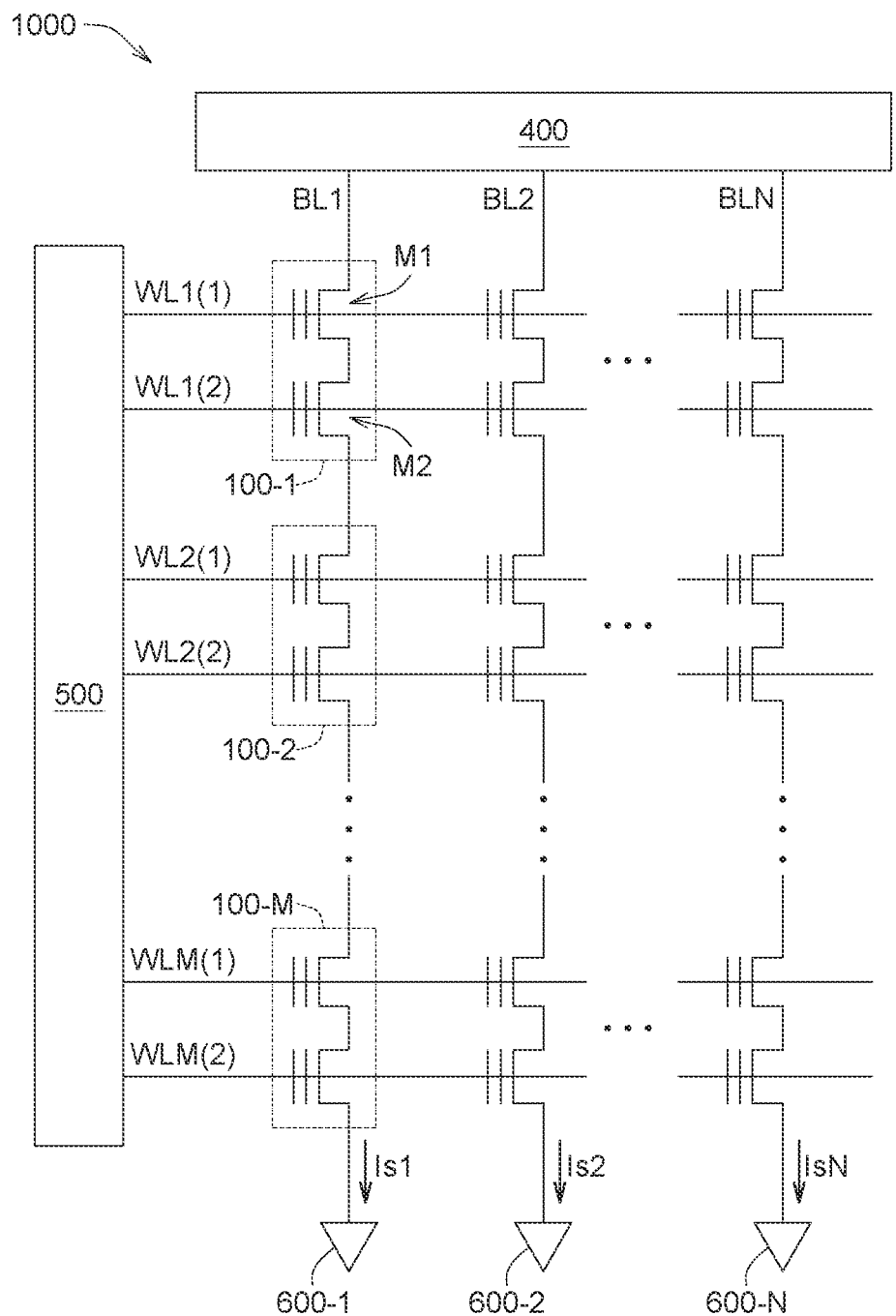
FIG. 13 is a schematic diagram of a memory device according to an embodiment of the present disclosure.

FIG. 13 is a schematic diagram of a memory device 1000 according to an embodiment of the present disclosure. The memory device 1000 includes a plurality of memory cells arranged in N vertical columns and M horizontal rows, and the memory cells in each vertical column may form a NAND memory string. For example, the memory cells 100-1, 100-2, . . . , 100-M in the first vertical column may form a NAND memory string. The memory cell 100-1 is connected to the first word line WL1(1) and the second word line WL1(2) of the first set of word lines WL1, and the memory cell 100-2 is connected to the first word line WL2(1) and the second word line WL2(2) of the second set of word lines WL2. Similarly, the memory cell 100-M is connected to the first word line WLM(1) and the second word line WLM(2) of the M-th set.

The memory cells 100-1, 100-2, . . . , 100-M are commonly connected to the first bit line BL1, and generate an output current Is1. A sensing amplifier (SA) 600-1 is connected to the bit line BL1 to receive the output current Is1. Similarly, the memory cells of the second vertical column are commonly connected to the second bit line BL2, and the sense amplifier 600-2 is connected to the bit line BL2 to receive the output current Is2. The memory cells of the N-th vertical column are commonly connected to the N-th bit line BLN, and the sense amplifier 600-N is connected to the bit line BLN to receive the output current IsN.

The bit line driving circuit 400 is connected to the bit lines BL1, BL2, . . . , BLN. The word line driving circuit 500 is connected to the first word lines WL1(1), WL2(1), . . . , WLM(1) and the second word lines WL1(2), WL2(2), . . . , WLM(2). The word line driving circuit 500 may serve as a search buffer for the search data SW to temporarily store the search data SW.

Taking a memory device 1000 with M=24 and N=8 as an example, it includes memory cells with 8 vertical columns and 24 horizontal rows. The transistors M1 and M2 of each memory cell are of MLC type. These memory cells may form 8's NAND memory strings. In the example of Table 3, the search data SW=[0 0] is provided to search the stored data DAT stored in the memory device 1000 with M=24 and N=8:

TABLE 3

|  | SW [00] | BL1 DAT [00] | BL2 DAT [01] | BL3 DAT [10] | BL4 DAT [11] | BL5 DAT | BL6 DAT | BL7 DAT | BL8 DAT |
| --- | --- | --- | --- | --- | --- | --- | --- | --- | --- |
| WL1(2) | VH4 | VT4 | VT3 | VT2 | VT1 | VT4 | VT4 | VT4 | VT4 |
| WL1(1) | VH1 | VT1 | VT2 | VT3 | VT4 | VT1 | VT1 | VT1 | VT1 |
| WL2(2) | VH4 | VT4 | VT3 | VT2 | VT1 | VT4 | VT4 | VT4 | VT4 |
| WL2(1) | VH1 | VT1 | VT2 | VT3 | VT4 | VT1 | VT1 | VT1 | VT1 |

TABLE 3-continued

| | SW [00] | BL1 DAT [00] | BL2 DAT [01] | BL3 DAT [10] | BL4 DAT [11] | BL5 DAT | BL6 DAT | BL7 DAT | BL8 DAT |
|---|---|---|---|---|---|---|---|---|---|
| WL3(2) | VH4 | VT4 | VT3 | VT2 | VT1 | VT4 | VT4 | VT4 | VT4 |
| WL3(1) | VH1 | VT1 | VT2 | VT3 | VT4 | VT1 | VT1 | VT1 | VT1 |
| WL4(2) | VH4 | VT4 | VT3 | VT2 | VT1 | VT4 | VT4 | VT4 | VT4 |
| WL4(1) | VH1 | VT1 | VT2 | VT3 | VT4 | VT1 | VT1 | VT1 | VT1 |
| WL5(2) | VH4 | VT4 | VT3 | VT2 | VT1 | VT4 | VT4 | VT4 | VT4 |
| WL5(1) | VH1 | VT1 | VT2 | VT3 | VT4 | VT1 | VT1 | VT1 | VT1 |
| WL6(2) | VH4 | VT4 | VT3 | VT2 | VT1 | VT4 | VT4 | VT4 | VT4 |
| WL6(1) | VH1 | VT1 | VT2 | VT3 | VT4 | VT1 | VT1 | VT1 | VT1 |
| WL7(2) | VH4 | VT4 | VT3 | VT2 | VT1 | VT4 | VT4 | VT4 | VT4 |
| WL7(1) | VH1 | VT1 | VT2 | VT3 | VT4 | VT1 | VT1 | VT1 | VT1 |
| WL8(2) | VH4 | VT4 | VT3 | VT2 | VT1 | VT4 | VT4 | VT4 | VT4 |
| WL8(1) | VH1 | VT1 | VT2 | VT3 | VT4 | VT1 | VT1 | VT1 | VT1 |
| WL9(2) | VH4 | VT4 | VT3 | VT2 | VT1 | VT4 | VT4 | VT4 | VT4 |
| WL9(1) | VH1 | VT1 | VT2 | VT3 | VT4 | VT1 | VT1 | VT1 | VT1 |
| WL10(2) | VH4 | VT4 | VT3 | VT2 | VT1 | VT4 | VT4 | VT4 | VT4 |
| WL10(1) | VH1 | VT1 | VT2 | VT3 | VT4 | VT1 | VT1 | VT1 | VT1 |
| WL11(2) | VH4 | VT4 | VT3 | VT2 | VT1 | VT4 | VT4 | VT4 | VT4 |
| WL11(1) | VH1 | VT1 | VT2 | VT3 | VT4 | VT1 | VT1 | VT1 | VT1 |
| WL12(2) | VH4 | VT4 | VT3 | VT2 | VT1 | VT4 | VT4 | VT4 | VT4 |
| WL12(1) | VH1 | VT1 | VT2 | VT3 | VT4 | VT1 | VT1 | VT1 | VT1 |
| WL13(2) | VH4 | VT4 | VT3 | VT2 | VT1 | VT3 | VT4 | VT4 | VT4 |
| WL13(1) | VH1 | VT1 | VT2 | VT3 | VT4 | VT2 | VT1 | VT1 | VT1 |
| WL14(2) | VH4 | VT4 | VT3 | VT2 | VT1 | VT3 | VT4 | VT4 | VT4 |
| WL14(1) | VH1 | VT1 | VT2 | VT3 | VT4 | VT2 | VT1 | VT1 | VT1 |
| WL15(2) | VH4 | VT4 | VT3 | VT2 | VT1 | VT3 | VT4 | VT4 | VT4 |
| WL15(1) | VH1 | VT1 | VT2 | VT3 | VT4 | VT2 | VT1 | VT1 | VT1 |
| WL16(2) | VH4 | VT4 | VT3 | VT2 | VT1 | VT3 | VT4 | VT4 | VT4 |
| WL16(1) | VH1 | VT1 | VT2 | VT3 | VT4 | VT2 | VT1 | VT1 | VT1 |
| WL17(2) | VH4 | VT4 | VT3 | VT2 | VT1 | VT3 | VT4 | VT4 | VT4 |
| WL17(1) | VH1 | VT1 | VT2 | VT3 | VT4 | VT2 | VT1 | VT1 | VT1 |
| WL18(2) | VH4 | VT4 | VT3 | VT2 | VT1 | VT3 | VT4 | VT4 | VT4 |
| WL18(1) | VH1 | VT1 | VT2 | VT3 | VT4 | VT2 | VT1 | VT1 | VT1 |
| WL19(2) | VH4 | VT4 | VT3 | VT2 | VT1 | VT3 | VT3 | VT4 | VT4 |
| WL19(1) | VH1 | VT1 | VT2 | VT3 | VT4 | VT2 | VT2 | VT1 | VT1 |
| WL20(2) | VH4 | VT4 | VT3 | VT2 | VT1 | VT3 | VT3 | VT4 | VT4 |
| WL20(1) | VH1 | VT1 | VT2 | VT3 | VT4 | VT2 | VT2 | VT1 | VT1 |
| WL21(2) | VH4 | VT4 | VT3 | VT2 | VT1 | VT3 | VT3 | VT4 | VT4 |
| WL21(1) | VH1 | VT1 | VT2 | VT3 | VT4 | VT2 | VT2 | VT1 | VT1 |
| WL22(2) | VH4 | VT4 | VT3 | VT2 | VT1 | VT3 | VT3 | VT2 | VT4 |
| WL22(1) | VH1 | VT1 | VT2 | VT3 | VT4 | VT2 | VT2 | VT3 | VT1 |
| WL23(2) | VH4 | VT4 | VT3 | VT2 | VT1 | VT3 | VT3 | VT2 | VT1 |
| WL23(1) | VH1 | VT1 | VT2 | VT3 | VT4 | VT2 | VT2 | VT3 | VT4 |
| WL24(2) | VH4 | VT4 | VT3 | VT2 | VT1 | VT3 | VT3 | VT2 | VT1 |
| WL24(1) | VH1 | VT1 | VT2 | VT3 | VT4 | VT2 | VT2 | VT3 | VT4 |
| Mismatch distance | | 0 L | 24 L | 48 L | 72 L | 12 L | 6 L | 6 L | 6 L |

As shown in Table 3, when the search data SW is [0 0], the second gate bias Vg2 is the fourth bias value VH4, and the first gate bias Vg1 is the first bias value VH1. For the NAND memory string of the bit line BL1, the stored data DAT of each memory cell is [0 0], and the first and second threshold voltages Vth1 and Vth2 are [VT4 VT1]. Accordingly, the stored data DAT of each memory cell of the bit line BL1 completely matches the search data SW. The mismatch distance of each memory cell of the bit line BL1 is "0", and the current value of the output current Is1 of each memory cell correspond to a gate overdrive voltage difference of "3L". The total current value of the output current Is1 of the bit line BL1 corresponds to levels of "72L" (i.e., 24×3L). The mismatch distance corresponds to levels of "0L".

For the NAND memory string of the bit line BL2, the stored data DAT of each memory cell is [0 1], and the first and second threshold voltages Vth1 and Vth2 are [VT3 VT2]. The mismatch distance of each memory cell is "1", and the current value of the output current Is1 of each memory cell corresponds to levels of "2L". The total current value of the output current Is2 of the bit line BL2 corresponds to levels of "48L" (i.e., 24×2L), which is smaller than the output current Is1 of the bit line BL1. The mismatch distance corresponds to levels of "24L".

The stored data DAT of each memory cell of the bit line BL3 is [1 0], and the first and second threshold voltages Vth1 and Vth2 are [VT2 VT3]. The mismatch distance of each memory cell is "2", and the current value of the output current Is1 of each memory cell corresponds to levels of "1L". The total current value of the output current Is3 of the bit line BL3 corresponds to levels of "24L" (i.e., 24×1L), which is smaller than the output current Is2 of the bit line BL2. The mismatch distance corresponds to levels of "48L".

The stored data DAT of each memory cell of the bit line BL4 is [1 1], and the first and second threshold voltages Vth1 and Vth2 are [VT1 VT4]. The mismatch distance of each memory cell is "3", and the current value of the output current Is1 of each memory cell corresponds to levels of "0L". The total current value of the output current Is4 of the bit line BL4 corresponds to levels of "0L" (i.e., 24×0L), which is smaller than the output current Is3 of the bit line BL3. The mismatch distance corresponds to levels of "72L".

The stored data DAT of the memory cells of the 1st to 12-th sets of word lines WL1-WL12 corresponding to the bit line BL5 are all [0 0], the first and second threshold voltages Vth1 and Vth2 are [VT4 VT1], and the mismatch distance is "0". The current value of the output current Is1 corresponds to levels of "3L". The stored data DAT of the memory cells of the 13-th to 24-th sets of word lines WL13-WL24 corresponding to bit line BL5 are all [0 1], the first and second threshold voltages Vth1 and Vth2 are [VT3 VT2], and the mismatch distance is "1", current value of the output current Is1 corresponds to levels of "2L". The total current value of the output current Is5 of the bit line BL5 corresponds to levels of "60L" (i.e., 12×3L+12×2L). The mismatch distance is "12L".

The stored data DAT of the memory cells of the 1st to 18-th sets of word lines WL1-WL18 of the bit line BL6 are all [0 0], the mismatch distance is "0", and the current value of the output current Is1 corresponds to levels of "3L". The stored data DAT of the memory cells of the 19-th to 24-th sets of word lines WL19-WL24 of the bit line BL6 are all [0 1], the mismatch distance is "1", and the current value of the output current Is1 corresponds to levels of "2L". The total current value of the output current Is6 of the bit line BL6 corresponds to levels of "66L" (i.e., 18×3L+6×2L). The mismatch distance corresponds to levels of "6L".

The stored data DAT of the memory cells of the 1st to 21st sets of word lines WL1-WL21 of the bit line BL7 are all [0 0], the mismatch distance is "0", and the current value of the output current Is1 corresponds to levels of "3L". The stored data DAT of the memory cells of the 22nd to 24-th sets of word lines WL22-WL24 of the bit line BL7 are all [1 0], the mismatch distance is "2", and the current value of the output current Is1 corresponds to levels of "1L". The total current value of the output current Is7 of the bit line BL7 corresponds to levels of "66L" (i.e., 21×3L+3×1L). The mismatch distance corresponds to levels of "6L".

The stored data DAT of the memory cells of the 1st to 22nd sets of word lines WL1-WL22 of the bit line BL8 are all [0 0], the mismatch distance is "0", and the current value of the output current Is1 corresponds to levels of "3L". The stored data DAT of the memory cells of the 23rd and 24-th sets of word lines WL23-WL24 of the bit line BL8 are all [1 1], the mismatch distance is "3", and the current value of the output current Is1 corresponds to levels of "0L". The total current value of the output current Is8 of the bit line BL8 corresponds to levels of "66L" (i.e., 22×3L+2×0L). The mismatch distance corresponds to levels of "6L".

According to the example shown in Table 3, when respective stored data DAT of the bit lines BL1-BL8 have different matching degrees with search data SW, respective output currents Is1-Is8 of the bit lines BL1-BL8 have different total current values. Hence, respective matching degrees of the bit lines BL1-BL8 may be calculated according to the total current value of the output currents Is1-Is8, so as to achieve a technical effect of approximate matching.

Figure 14A:
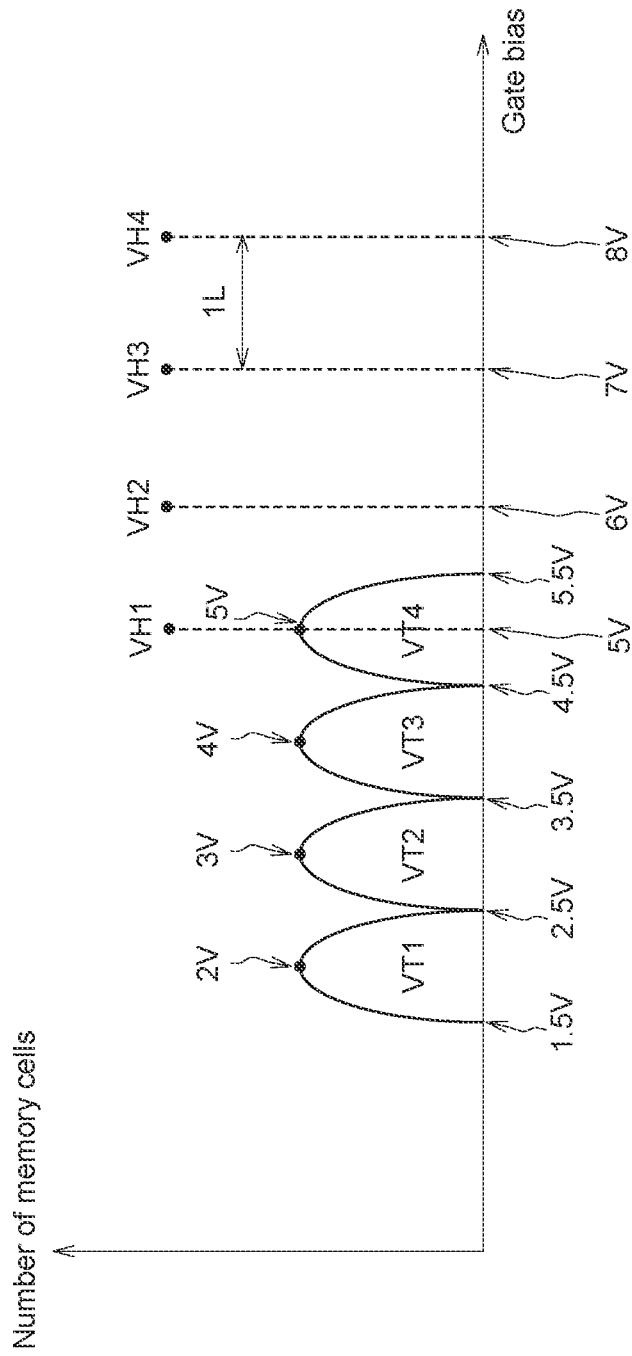
FIG. 14A shows another example of voltage values of the first to fourth bias values and the first to fourth voltage distributions.

FIG. 14A shows another example of voltage values of the first to fourth bias values VH1~VH4 and the first to fourth voltage distributions VT1~VT4. The example of FIG. 14A is similar to the example of FIG. 3, with difference in that: in the example of FIG. 14A, the voltage difference between two adjacent bias values of the first to fourth bias values VH1~VH4 is 1V. That is, the predefined level (1L) is 1V.

Furthermore, the voltage difference between the peak voltage values of two adjacent voltage distributions of the first to fourth voltage distributions VT1~VT4 is 1V. The voltage difference between the highest voltage values of two adjacent voltage distributions of the first to fourth voltage distributions VT1~VT4 is 1V. The voltage difference between the lowest voltage values of two adjacent voltage distributions of the first to fourth voltage distributions VT1~VT4 is also 1V. Moreover, the first bias value VH1 is equal to the peak voltage value of the fourth voltage distribution (as 5V).

Figure 14B:
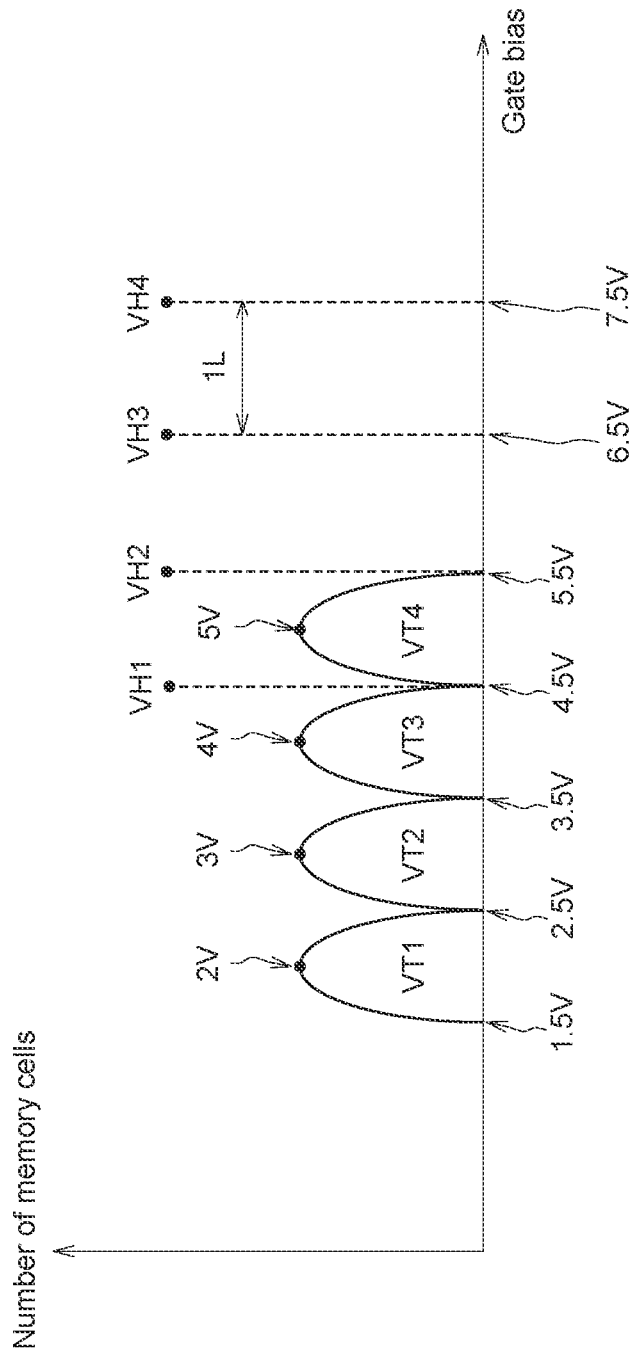
FIG. 14B shows still another example of voltage values of the first to fourth bias values and the first to fourth voltage distributions.

FIG. 14B shows still another example of voltage values of the first to fourth bias values VH1~VH4 and the first to fourth voltage distributions VT1~VT4. The example of FIG. 14B is similar to the example of FIG. 14A, with difference in that: in the example of FIG. 14B, the first bias value VH1 is equal to the lowest voltage value of the fourth voltage distribution (as 4.5V).

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A memory device for in-memory search, the memory device comprises a plurality of memory cells, each of the memory cells stores a stored data and receives a search data, each of the memory cells comprising:
   a first transistor, having a first threshold voltage and receiving a first gate bias; and
   a second transistor, connected to the first transistor, the second transistor has a second threshold voltage and receives a second gate bias;
   wherein, the stored data is encoded according to the first threshold voltage and the second threshold voltage, the search data is encoded according to the first gate bias and the second gate bias, there is a mismatch distance between the stored data and the search data, and an output current generated by each of the memory cells is related to the mismatch distance.

2. The memory device according to claim 1, wherein:
   the first threshold voltage and the second threshold voltage both have a plurality of voltage distributions, the first gate bias and the second gate bias both have a plurality of bias values, the number of the voltage distributions is equal to a first number, the number of the bias values is equal to the first number; and
   the stored data is encoded according to the first number of voltage distributions, and the search data is encoded according to the first number of the bias values.

3. The memory device according to claim 2, wherein the first transistor and the second transistor are both multi-level cells (MLC), the first number is equal to "4", the stored data has two bits, and the search data has two bits.

4. The memory device according to claim 3, wherein the first number of voltage distributions comprising:
   a first voltage distribution, a second voltage distribution, a third voltage distribution and a fourth voltage distribution, the fourth voltage distribution has highest voltage value, and the first voltage distribution has lowest voltage value;
   wherein, when the first threshold voltage has the first voltage distribution and the second threshold voltage has the first voltage distribution, the stored data is encoded as "don't care", the search data completely matches the stored data, and the mismatch distance is "0".

5. The memory device according to claim 3, wherein the first number of bias values comprising:
   a first bias value, a second bias value, a third bias value and a fourth bias value, the fourth bias value has highest voltage value, and the first bias value has lowest voltage value;
   wherein, when the first gate bias has the fourth bias value and the second gate bias has the fourth bias value, the search data is encoded as "wildcard", the search data completely matches the stored data, and the mismatch distance is "0".

6. The memory device according to claim 2, wherein the first transistor and the second transistor are both triple-level cells (TLC), and the first number is equal to "8".

7. The memory device according to claim 2, wherein the first transistor and the second transistor are both quad-level cells (QLC), and the first number is equal to "16".

8. The memory device according to claim 2, wherein, there is a first voltage difference between the first gate bias and the first threshold voltage of the first transistor, and there is a second voltage difference between the second gate bias and the second threshold voltage of the second transistor, and the smaller one of the first voltage difference and the second voltage difference is related to a current value of the output current.

9. The memory device according to claim 8, wherein a voltage difference between two adjacent bias values among the bias values is equal to a predefined level, and a voltage difference between respective maximum voltage values of two adjacent voltage distributions among the voltage distributions is equal to the predefined level, the first voltage difference is equal to an integer multiple of the predefined level, and the second voltage difference is equal to an integer multiple of the predefined level.

10. The memory device according to claim 9, wherein the first transistor and the second transistor are both multi-level cells (MLC), when the search data completely matches the stored data, the mismatch distance is "0", the first voltage difference is equal to three times of the predefined level, and the second voltage difference is equal to three times of the predefined level.

11. The memory device according to claim 1, wherein first transistor has a first gate, a first drain and a first source, and the second transistor has a second gate, a second drain and a second source;
wherein, the first gate of the first transistor is connected to a first word line to receive the first gate bias, and the second gate of the second transistor is connected to a second word line to receive the second gate bias, the first drain of the first transistor is connected to a bit line, the first source of the first transistor is connected to the second drain of the second transistor, and the second source of the second transistor outputs the output current.

12. A data search method for a memory, the memory comprises a plurality of memory cells, each of the memory cells comprises a first transistor and a second transistor, and the data search method comprising:
encoding a stored data according to a first threshold voltage of the first transistor and a second threshold voltage of the second transistor; and
encoding a search data according to a first gate bias and a second gate bias, and there is a mismatch distance between the stored data and the search data,
wherein an output current generated by each of the memory cells is related to the mismatch distance.

13. The data search method according to claim 12, wherein the first threshold voltage and the second threshold voltage both have a plurality of voltage distributions, the number of the voltage distributions is equal to a first number, and the data search method comprising:
encoding the stored data according to the first number of voltage distributions.

14. The data search method according to claim 13, wherein the first transistor and the second transistor are both multi-level cells (MLC), the first number is equal to "4", the first number of voltage distributions comprise a first voltage distribution, a second voltage distribution, a third voltage distribution and a fourth voltage distribution, and the data search method comprising:
programming the first threshold voltage to have the first voltage distribution;
programming the second threshold voltage to have the first voltage distribution;
encoding the stored data as "don't care" according to the first threshold voltage and the second threshold voltage;
determining that the mismatch distance is "0"; and
determining that the search data completely matches the stored data.

15. The data search method according to claim 14, wherein the first gate bias and the second gate bias both have a plurality of bias values, the number of the bias values is equal to the first number, and the data search method comprising:
encoding the search data according to the first number of bias values.

16. The data search method according to claim 15, wherein the first number of bias values comprise a first bias value, a second bias value, a third bias value and a fourth bias value, and the data search method comprising:
transmitting the fourth bias value as the first gate bias;
transmitting the fourth bias value as the second gate bias;
encoding the search data as "wildcard" according to the first gate bias and the second gate bias;
determining that the mismatch distance is "0"; and
determining that the search data completely matches the stored data.

* * * * *